(12) United States Patent
Shen et al.

(10) Patent No.: US 7,573,969 B2
(45) Date of Patent: Aug. 11, 2009

(54) COUNTER USING SHIFT FOR ENHANCED ENDURANCE

(75) Inventors: Eran Shen, Nahariya (IL); Rotem Sela, Maalot (IL); Aviad Zer, Kfar Vradim (IL); Oren N. Honen, Yokneam (IL); Ido Shilo, Jordan Valley (IL)

(73) Assignee: Sandisk Il Ltd., Kfar Saba (IL)

( * ) Notice: Subject to any disclaimer, the term of this patent is extended or adjusted under 35 U.S.C. 154(b) by 130 days.

(21) Appl. No.: 11/862,461

(22) Filed: Sep. 27, 2007

(65) Prior Publication Data

US 2009/0086880 A1    Apr. 2, 2009

(51) Int. Cl.
G06M 3/00    (2006.01)

(52) U.S. Cl. ............................. 377/26; 377/28; 377/33; 377/34

(58) Field of Classification Search .................. 377/26, 377/28, 33, 34
See application file for complete search history.

(56) References Cited

U.S. PATENT DOCUMENTS

| | | | |
|---|---|---|---|
| 2,632,058 A | 3/1953 | Gray | |
| 4,947,410 A * | 8/1990 | Lippmann et al. | 377/26 |
| 6,249,562 B1 * | 6/2001 | Wells | 377/26 |
| 6,792,065 B2 | 9/2004 | Maletsky | |
| 6,794,997 B2 | 9/2004 | Sprouse | |
| 7,065,607 B2 * | 6/2006 | England et al. | 711/103 |
| 7,245,556 B1 | 7/2007 | Pinto et al. | |
| 2004/0141580 A1 | 7/2004 | Maletsky | |
| 2005/0111287 A1 | 5/2005 | Du et al. | |

FOREIGN PATENT DOCUMENTS

WO    WO-2007076492    7/2007

OTHER PUBLICATIONS http://gray-williams.livejournal.com.
"Counting sequences, Gray Codes and Lexicodes", by Suparta, Delft University of Technology, 2006.
G.S. Bhat, et al., "Balanced Gray Codes", The Electronic Journal of Combinatorics 3 (1996), #R25.

* cited by examiner

*Primary Examiner*—Tuan Lam
(74) *Attorney, Agent, or Firm*—Darby & Darby P.C.

(57) ABSTRACT

A counting device includes a set of memory cells, which are configured to store respective bits of a count code. A controller is coupled to the memory cells so as to increment, in response to occurrences of a count input, the count code in the set of the memory cells from an initial value up to a preset bound in each of a plurality of successive iterations, and to shift the bits of the count code that are respectively stored in the memory cells in each of the iterations relative to a preceding iteration.

25 Claims, 6 Drawing Sheets

COUNTER USING SHIFT FOR ENHANCED ENDURANCE

FIELD OF THE INVENTION

The present invention relates generally to electronic devices and circuits, and specifically to counting devices.

BACKGROUND OF THE INVENTION

There are a number of types of non-volatile memory (NVM) media available that can be programmed multiple times. Examples of such media include electronic memory, such as flash electronically-erasable programmable read-only memory (EEPROM) devices, and optical memory, such as rewritable compact disc (CD) and digital video disc (DVD) media. Such media, however, typically wear out after a certain number of write/erase cycles. Flash EEPROM devices, for instance, are typically rated to endure between 10,000 and 100,000 write/erase cycles, after which the devices become unreliable.

U.S. Pat. No. 6,794,997, to Sprouse, whose disclosure is incorporated herein by reference, describes a method for extending the endurance of non-volatile memory using data encoding. One or more data bits are encoded into a larger number of non-volatile memory bit patterns such that changes to the data bits are distributed across fewer changes per non-volatile memory bit. Non-volatile memory endurance is extended since more changes to the data values are possible than can be supported by underlying changes to individual non-volatile memory bits.

One of the embodiments disclosed in this patent uses Gray codes, which were initially described by Gray in U.S. Pat. No. 2,632,058, whose disclosure is incorporated herein by reference. A Gray code is an encoding of information in which for a defined sequence, only a single bit changes state with each step through the sequence. (A conventional binary counter does not have this property.) According to Sprouse, the use of a Gray code sequence stored in non-volatile memory to encode a single data bit in effect allows the previous contents of the non-volatile memory to be used to control the next state. Thus, each single data bit change is translated into a single non-volatile memory bit change, and is distributed across multiple non-volatile memory bits.

U.S. Pat. No. 7,245,556, to Pinto, et al., whose disclosure is incorporated herein by reference, similarly describes methods for writing to non-volatile memories for increased endurance. A relatively small memory is made up of a number of individually-accessible write segments, each made up of a single memory cell or a small number of cells. A count is encoded so that it is distributed across a number of fields, each associated with one of the write segments. As the count is incremented, only a single field is changed, and these changes are evenly distributed across the fields. The changed field is then written to the corresponding segment, while the other write segments are unchanged. Consequently, the number of rewrites to a given write segment is decreased, and the lifetime correspondingly increased, by a factor corresponding to the number of write segments used.

Another approach to counting beyond endurance limits of non-volatile memories is described by Maletsky in U.S. Pat. No. 6,792,065, whose disclosure is incorporated herein by reference. The storage cells in a non-volatile memory are subdivided into two groups, one for the implementation of a rotary counter that keeps track of the less significant part of the count and another for a binary counter that keeps track of the more significant part of the count. The rotary counter implements a counting method that maximizes the count that can be obtained before the endurance limit of the memory is reached by making sure that each change of state of each cell is recorded as one count and that all cells in the rotary counter experience two change of state in every cycle. The binary counter records the number of cycles the rotary counter has gone through.

SUMMARY OF THE INVENTION

An embodiment of the present invention provides a counting device, including:

a set of memory cells, which are configured to store respective bits of a count code; and a controller, which is coupled to the memory cells so as to increment, in response to occurrences of a count input, the count code in the set of the memory cells from an initial value up to a preset bound in each of a plurality of successive iterations, and to shift the bits of the count code that are respectively stored in the memory cells in each of the iterations relative to a preceding iteration.

In a disclosed embodiment, the count code is a Gray code, and the memory cells are a part of a non-volatile memory, such as a Flash memory. The preset bound may be defined by an endurance of the memory cells. Typically, the controller is configured to read out a counter value by determining a shift of the bits of the count code in the memory cells, locating and decoding the count code responsively to the shift, and combining the decoded count code with a number of the iterations indicated by the shift in order to compute the counter value.

In some embodiments, the set of the memory cells is a first set, and the device includes a second set of the memory cells for storing a state indicator, and the controller is coupled to increment the state indicator and to reset the count code to the initial value upon receiving the count input when the count code has reached the preset bound.

In other embodiments, the set of the memory cells is configured to hold data of a given length, and the number of the bits in the count code is less than the given length, and the controller is coupled to store the count code in a subset of the set of the memory cells, and to shift the bits so that the count code is stored in a different subset of the set of the memory cells in each of the successive iterations relative to a preceding iteration.

There is also provided, in accordance with an embodiment of the present invention, a counting device, including:

an array of memory cells, including a first set of the memory cells for storing respective bits of a count code and a second set of the memory cells for storing a state indicator; and a controller, which is coupled to the array so as to increment, in response to occurrences of a count input, the bits of the count code in the first set of the memory cells from an initial value up to a preset bound in each of a plurality of successive iterations, and upon reaching the preset bound in each of the successive iterations, to increment the state indicator and to initiate a new iteration in which the bits that are respectively stored in the memory cells are shifted relative to a preceding iteration.

In a disclosed embodiment, the bits are barrel-shifted in each of the successive iterations.

In another embodiment, the bits are shifted so that the count code is stored in a different subset of the first set of the memory cells in each of the successive iterations relative to the preceding iteration.

There is additionally provided, in accordance with an embodiment of the present invention, a counting device, including:

an array of memory cells, including a set of the memory cells that is configured to hold data of a given length and is allocated for storage of a count code consisting of a number of bits that is less than the given length; and a controller, which is coupled to the array so as to store the count code in a subset of the set of the memory cells, and to increment, in response to occurrences of a count input, the bits of the count code from an initial value up to a preset bound in each of a plurality of successive iterations, and to shift the bits so that the count code is stored in a different subset of the set of the memory cells in each of the successive iterations relative to a preceding iteration.

In disclosed embodiments, the controller is configured to write the count code to the subset of the set of the memory cells as a sequence of bits, and to write a predetermined delimiter value to the bits in the set of the memory cells that immediately precede and succeed the sequence. Typically, the controller is configured to write a predetermined constant value, different from the delimiter value, to the bits in the set of the memory cells that are separated from the subset of the set of the memory cells by the bits that immediately precede and succeed the sequence.

In one embodiment, the sequence includes at least first and second sub-sequences, and the controller is configured to write the predetermined delimiter value to at least one bit in the set of the memory cells that separates the first subsequence from the second subsequence. In this embodiment, the number of the bits in the count code may be greater than one half of the given length.

There is further provided, in accordance with an embodiment of the present invention, a method for counting, including:

in response to occurrences of a count input, incrementing bits of a count code that are respectively stored in a set of memory cells from an initial value up to a preset bound in each of a plurality of successive iterations; and in each of the successive iterations, shifting the bits of the count code that are respectively stored in the memory cells relative to a preceding iteration.

The present invention will be more fully understood from the following detailed description of the embodiments thereof, taken together with the drawings in which:

BRIEF DESCRIPTION OF THE DRAWINGS

FIGS. 5-7 are tables that schematically illustrate successive iterations of counters in accordance with alternative embodiments of the present invention.

DETAILED DESCRIPTION OF EMBODIMENTS

Overview

Figure 1:
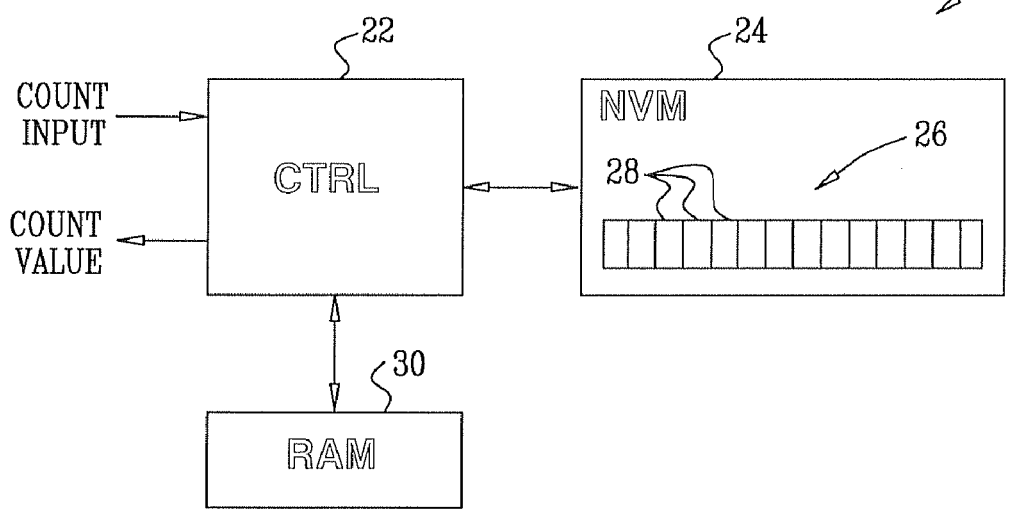
FIG. 1 is a block diagram that schematically illustrates a counting device, in accordance with an embodiment of the present invention.

As explained in the Background of the Invention, the range of a counter that is implemented in non-volatile memory (NVM) is limited the write/erase endurance of the memory itself, i.e., by the number of times a value stored in a cell of the memory can be changed before the memory cell wears out. Gray codes are helpful in pushing the limit, since they minimize the number of bits that must be inverted each time the counter is incremented. Even so, in the classical Gray code described in the above-mentioned U.S. Pat. No. 2,632,058, the least significant bit (LSB) is toggled twice as frequently as the next bit, and so forth: In counting up to a value N, the LSB is inverted N/2 times, the next bit N/4 times, the next N/8, and so forth. Therefore, when this Gray code is used in the ordinary way, the LSB will wear out long before the other bits, and the maximum value that the counter can reach will thus be limited to a value equal approximately to twice the bit endurance of the LSB. Although balanced Gray codes have been proposed to spread the inversion load more evenly over the counter bits, such balanced codes are not straightforward to derive or implement in the context of NVM counters.

Embodiments of the present invention extend the range of the counter beyond the Gray code limit by incorporating a shift into the count process. In these embodiments, the bits of a count code (such as a Gray code) are stored in a set of the memory cells. At each occurrence of a count input, the code is incremented from an initial value up to a preset bound. When the code reaches the bound, the bits are shifted, and a new iteration begins from the initial value of the code. Thus, the position of the LSB (and of each of the other bits in the code) shifts to different cells in successive iterations, and the wear due to bit inversion is spread evenly over the cells in the counter. As a result, a counter that stores a Gray code in a memory M bits long with bit endurance N, for example, will be able to count up to a maximum value of M*N.

In order to read out the actual value stored in the counter, it is necessary to determine how far the bits have shifted, i.e., which memory cell currently holds the most significant bit (MSB) and which holds the LSB. For this purpose, in some embodiments, the memory also stores a state indicator, which is incremented at each new iteration. The value of the state indicator thus identifies the locations of the bits in the memory cells.

In other embodiments, the count code is held in a set of the memory cells that is configured to hold data longer than the number of bits in the count code. The set of memory cells will therefore contain some unused bits, and the count code will be stored in a different subset of the set of memory cells in each iteration. A delimiter value may be stored in the bits that immediately precede and succeed the sequence of bits in the count code in order to identify the locations of the bits in the count code when the counter value is read out.

As explained above, Gray codes are an advantageous sort of count code to use in embodiments of the present invention. The principles of the present invention, however, may also be applied using count codes of other types. In this context, the simple binary representation of the count value may itself be considered a type of count code. Furthermore, although the embodiments described herein use single-level memory cells, each holding a single bit, the principles of the present invention may likewise be applied to substantially any kind of multiple-time programmable NVM, including multi-level cells and other technologies. The techniques described herein may also be used, mutatis mutandis, in encoding a count so that it is distributed across a number of fields, in a manner analogous to that described in the above-mentioned U.S. Pat. No. 7,245,556.

Design and Operation of the Counting Device

FIG. 1 is a block diagram that schematically shows a counting device 20, in accordance with an embodiment of the present invention. A controller 22 receives a count input, which typically signals the occurrence of a given type of event that is to be counted. The controller may comprise a programmable computing device, such as a microprocessor, which carries out the functions that are described herein under the control of software or firmware. Alternatively or additionally, the controller may comprise a hard-wired or programmable logic device, such as a suitable application-specific integrated circuit (ASIC).

Controller 22 is coupled to write to and read from a non-volatile memory (NVM) 24, comprising an array of memory cells 28. At each occurrence of the count input, the controller increments a count code that is held in a set 26 of the memory cells, as described in detail hereinbelow. The controller may subsequently read and decode the count code in order to output a count value that reflects the cumulative number of occurrences of the count input. The controller and memory in device 20 may be dedicated for use in this counting function. Alternatively, the controller and memory may also perform other functions, in addition to counting occurrences of the count input, but these functions are beyond the scope of the present invention. Optionally, for enhanced efficiency and speed, controller 22 may use a volatile random-access memory (RAM) 30 for some of the computational functions that are described hereinbelow.

In the present embodiment, it is assumed that NVM 24 comprises an array of NAND flash memory cells, with a typical endurance of N=15,000 write/erase cycles. In alternative embodiments, however, the NVM may comprise NOR flash or another type of EEPROM, or substantially any other type of NVM that permits multiple-time programming, including read/write optical memory media.

Figure 2:
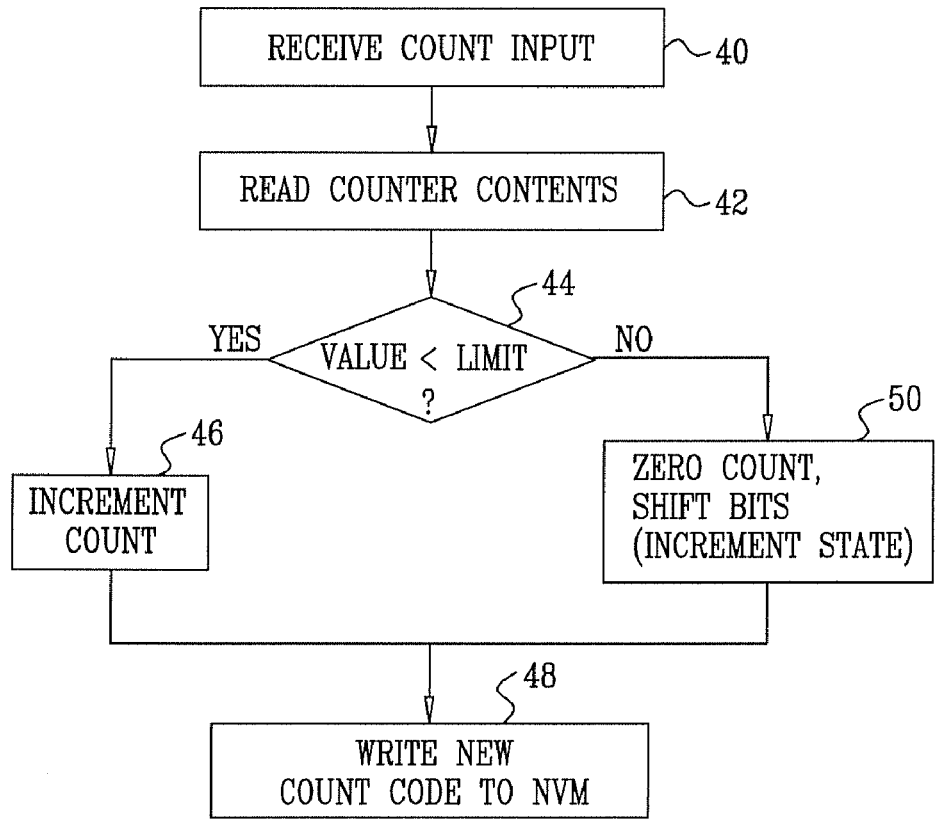
FIG. 2 is a flow chart that schematically illustrates a method for counting using a non-volatile memory, in accordance with an embodiment of the present invention.
Figure 3:
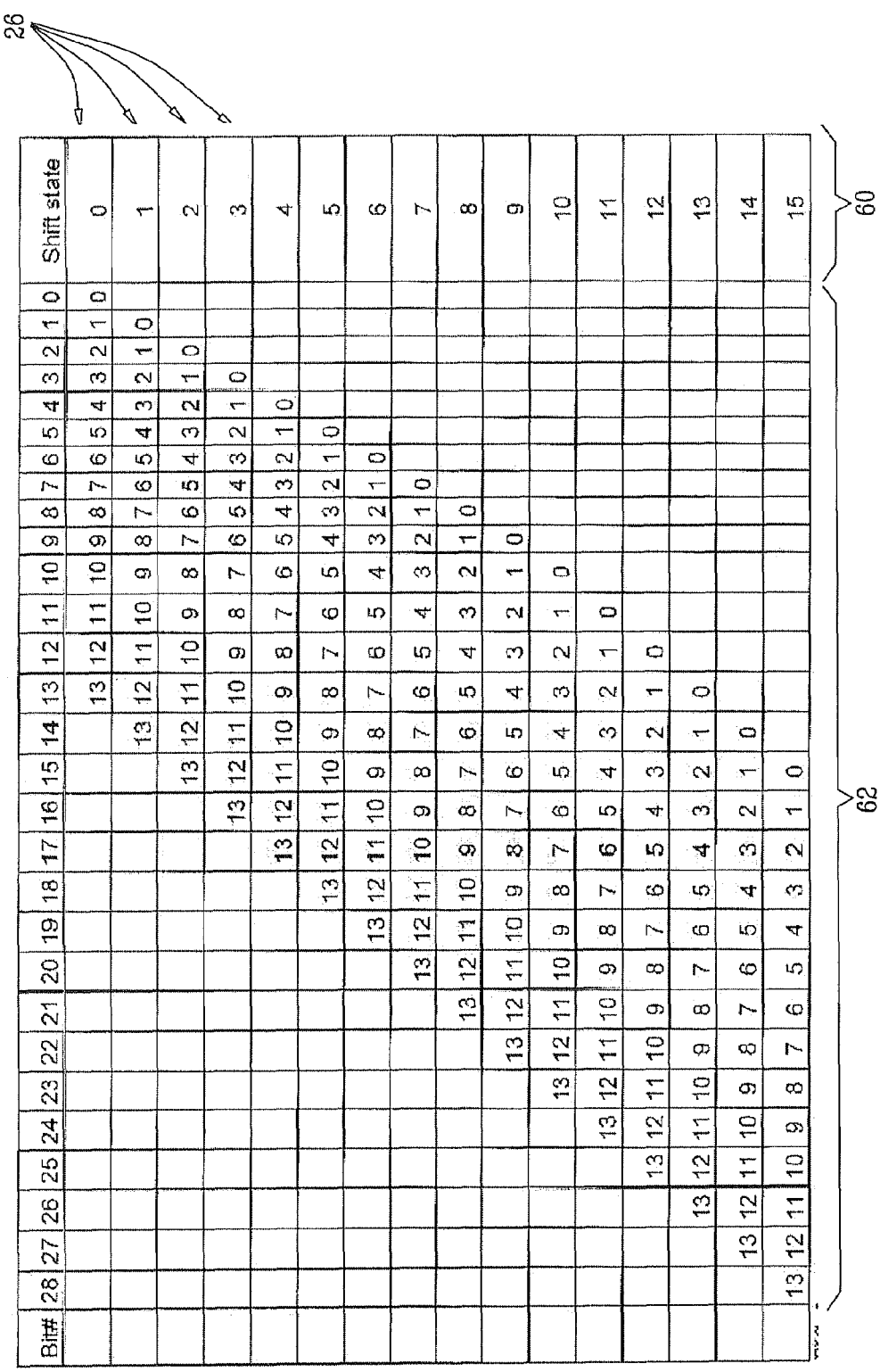
FIG. 3 is a table that schematically illustrates successive iterations of a counter, in accordance with an embodiment of the present invention.

Reference is now made to FIGS. 2 and 3, which schematically illustrate a method for counting using device 20, in accordance with an embodiment of the present invention. FIG. 2 is a flow chart showing the steps of the method. FIG. 3 is a table showing the assignment of count bits to cells 28 in set 26 at successive iterations of the counter in accordance with this method.

As shown in FIG. 3, set 26 in this embodiment comprises a field 62 of twenty-nine bits, which are labeled in the heading row of the table. The count code itself comprises fourteen bits, labeled 0 (LSB) through 13 (MSB). (A fourteen-bit code is chosen because $14=\text{ceil}[\log_2(N)]$.) The first row of the table below the heading (marked as shift state 0) shows the positions of the bits of the count code in the first iteration, the second row shows the positions in the second iteration, and so forth. Set 26 also includes a shift state counter field 60, which in the present example may comprise four bits. The numbers of bits in fields 60 and 62 were chosen in this example solely for the sake of convenience and clarity of explanation. These fields may alternatively comprise larger or smaller numbers of bits, depending on factors such as the endurance of the memory, the maximum target count value, and the availability of cells in the memory. In another example, shown below in FIG. 5, the number of bits in field 62 is equal to the number of bits in the count code.

The count code in field 62 begins at an initial value (typically zero) in shift state zero and is incremented each time controller 22 receives a count input, at an input step 40. To determine the new count code that is to be written to field 62, the controller reads the current counter value, at a read step 42. For this purpose, it may be necessary for the controller to read out and decode the count code and shift state from NVM 24, in the manner described hereinbelow in reference to FIG. 4. Alternatively, during active operation of device 20, the controller may use RAM 30 as a sort of cache, to hold the current counter value and thus avoid the need to read and decode the value in the NVM at every count.

The count code has a preset bound, which serves as a limit on the value that the count code is allowed to reach. This limit may be determined according to the prescribed bit endurance of NVM 24. In the present example, the limit is set to N=15,000, as explained above. Alternatively, the limit may be set to a greater or lesser value, depending on considerations of cost and reliability. The controller checks the current counter value against this limit, at a limit checking step 44. If the value is less than the limit, the controller simply increments the count code, at a code incrementing step 46. In the case of Gray codes, this step will entail inversion of a single bit in the count code. The controller then writes the new count code to field 62, at a write step 48, simply by inverting the appropriate bit. The shift state value in field 60 is unchanged.

On the other hand, if the controller determines at step 44 that the count code has reached the limit, it resets the code to the initial (zero) value, at a shift step 50. A new iteration through the range of count codes will now begin, with the bit positions shifted within field 62. In the case shown in FIG. 3, for example, after reaching the limit in shift state 0, the bits of the count code are shifted one cell to the left in shift state 1, so that the LSB is now in bit #1 of field 62, and the MSB is now in bit #14. Alternatively, other shift schemes may be implemented, not necessarily based on the sort of linear, single bit shift that is used in the embodiments described herein. All such shift schemes are considered to be within the scope of the present invention.

In the embodiment illustrated in FIG. 3, in order to keep track of the set of bits in field 62 that are now holding the count code, controller 22 increments the value in field 60. Thus, the value in this field indicates the number of bits to skip from the zero bit position in field 62 in order to find the LSB of the count code. Alternatively, other means may be used to delineate the set of bits in field 62 that are currently holding the count code, as in the embodiments shown below in FIGS. 6 and 7. In such embodiments, the shift state counter is not needed. In any case, the controller writes the new count code to the shifted position in field 62 of NVM 24 at step 48.

In practice, controller 22 may implement steps 44, 46 and 50 implicitly by suitable arithmetic operations. For example, following each count input, the controller may increment the counter value and then compute floor[counter/N] to determine the current shift state. The count code to be written to the appropriate set of bits is given by code[$\text{mod}_N$(counter)]. The controller compares the new count code and shift state values to the values currently held in fields 62 and 60, and inverts whichever bits are necessary to give the new values.

As explained above, in the course of incrementing a Gray code successively from zero up to N, the LSB is inverted N/2 times, the next bit N/4 times, the next N/8, and so forth. Therefore, in the course of incrementing the code up to the limit in fourteen successive shift states, a given bit will be inverted $N/2+N/4+N/8+\ldots N/2^{14} \cong N$ times. Thus, each bit in field 62 is used up to the endurance limit of NVM 24, and no more. In the example shown in FIG. 3, the total range of the counter will be the product of the number of shift states by N, i.e., 16*N, assuming a four-bit shift state counter. Alternatively, if the shift state counter contains an additional bit, and the count code is allowed to wrap around following shift state 15 (as in the alternative embodiments that are described below), the total range of the counter will be 29*N.

Figure 4:
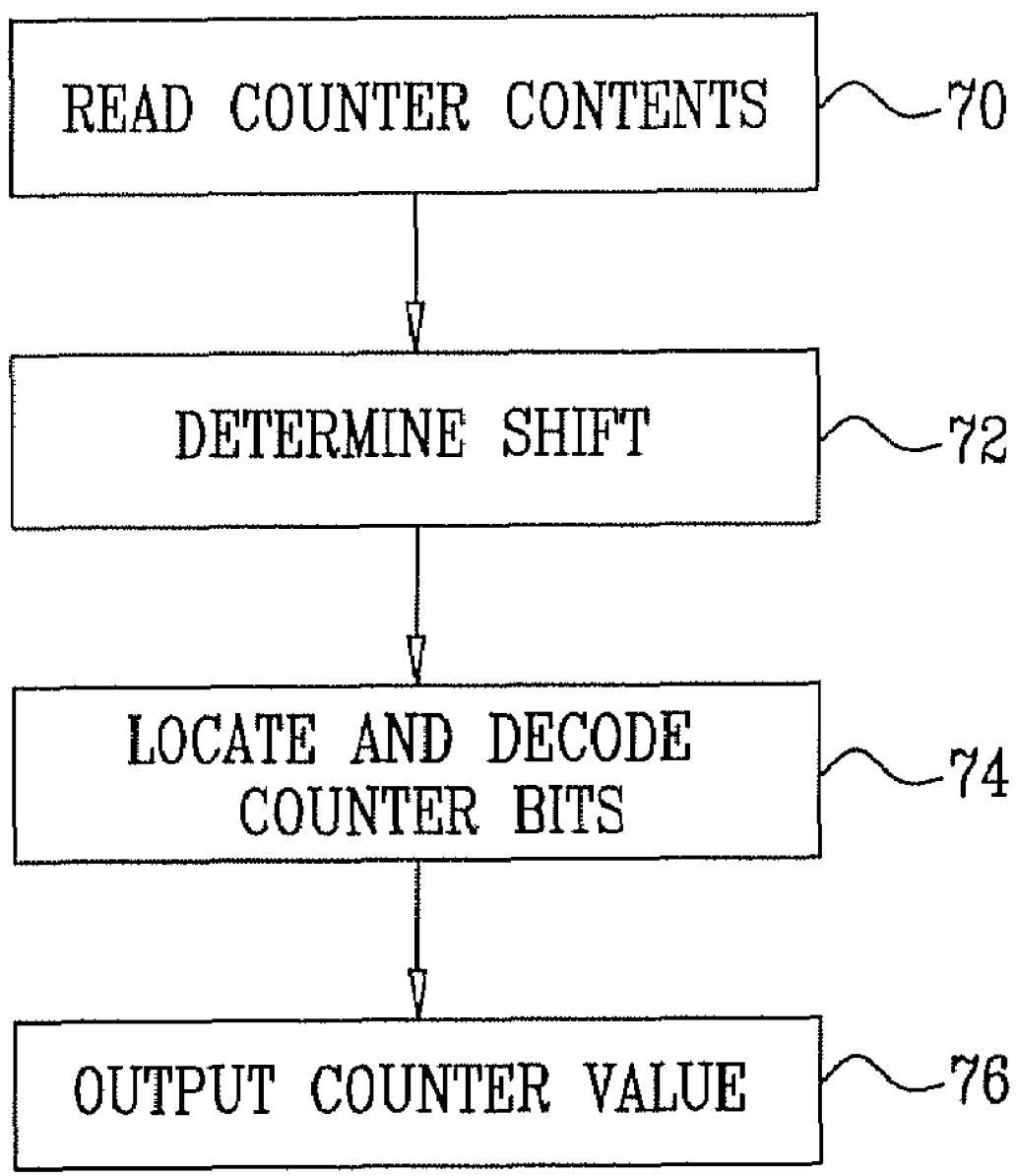
FIG. 4 is a flow chart that schematically illustrates a method for reading a counter value from a counting device, in accordance with an embodiment of the present invention.

FIG. 4 is a flow chart that schematically illustrates a method for reading a count value from device 20, in accordance with an embodiment of the present invention. This method may be used by controller 22 in response to a request from an external source, such as a host CPU. Additionally or alternatively, it may be invoked internally by controller 22 when it needs to determine the count value, such as at step 42 (FIG. 2).

Controller 22 reads the contents of cells 28 in set 26, at a read step 70. When a shift state counter is used, the controller reads the contents of both the field containing the count code and the shift state field. The counter then uses the shift state value to determine the shift of the count code within the count field, at a shift determination step 72. Alternatively, when the shift state counter is not used, the controller may determine the shift by locating certain delimiting bits, as shown below in FIGS. 6 and 7. The controller uses the shift to locate the bits of the count code, and decodes these bits to recover the numerical value of the code, at a decoding step 74. The controller then outputs the counter value, at an output step 76, wherein the output value is given by the formula: output=shift*N+decode (count code).

Alternative Embodiments

Figure 5:
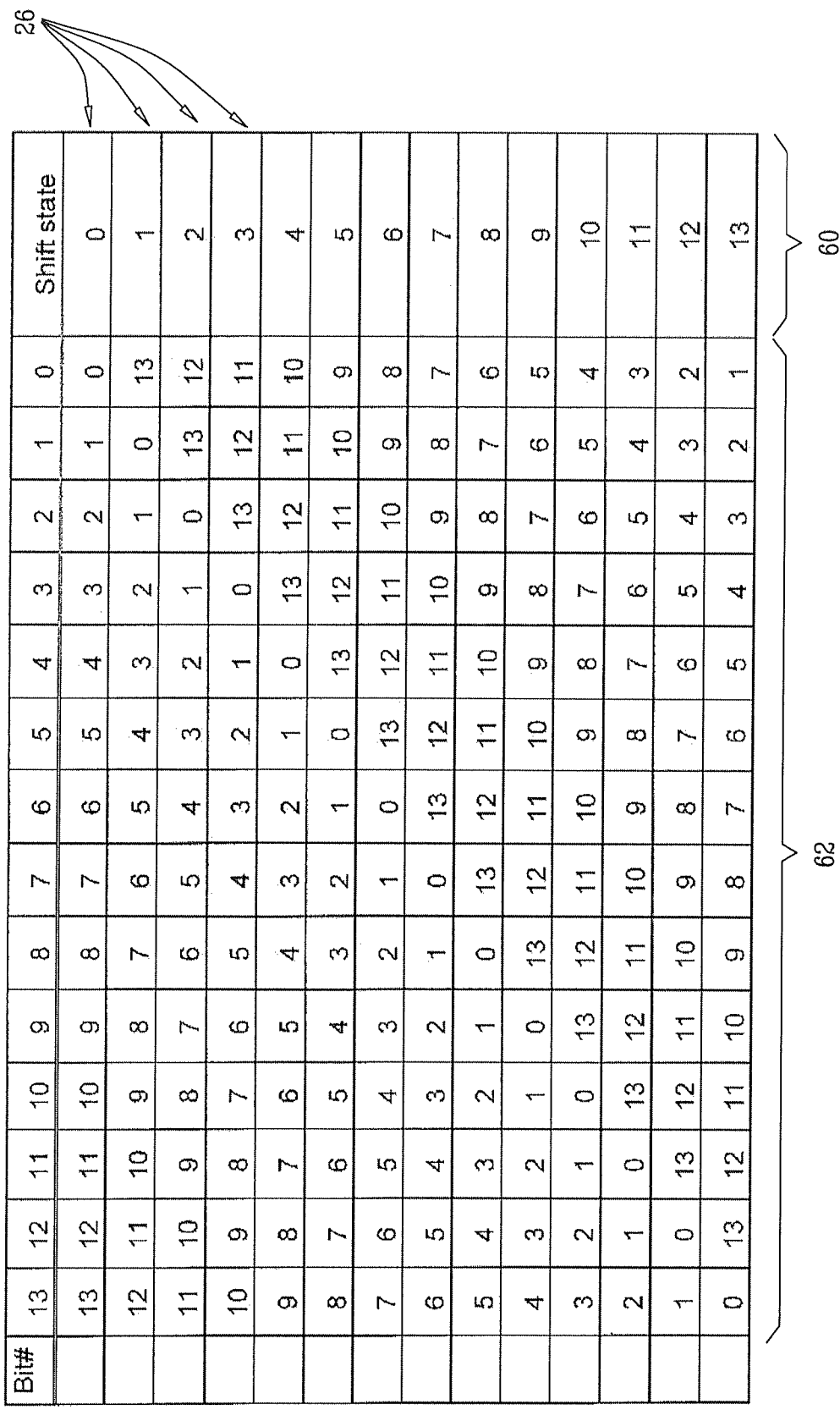

FIG. 5 is a table showing the assignment of count bits to cells 28 in set 26 at successive iterations of counting device 20, in accordance with an alternative embodiment of the present invention. The operation of this embodiment is similar to that of the embodiment of FIG. 3, except that all bits of field 62 are used in every iteration. In other words, at each iteration through step 50 (FIG. 2), the bits of the count code in field 62 are barrel-shifted, and the shift state counter in field 60 is incremented. Thus, all bits in the count code field are used to the endurance limit of NVM 24, and the total range of the counter is maximized relative to the endurance and the number of bits in the counter.

Figure 6:
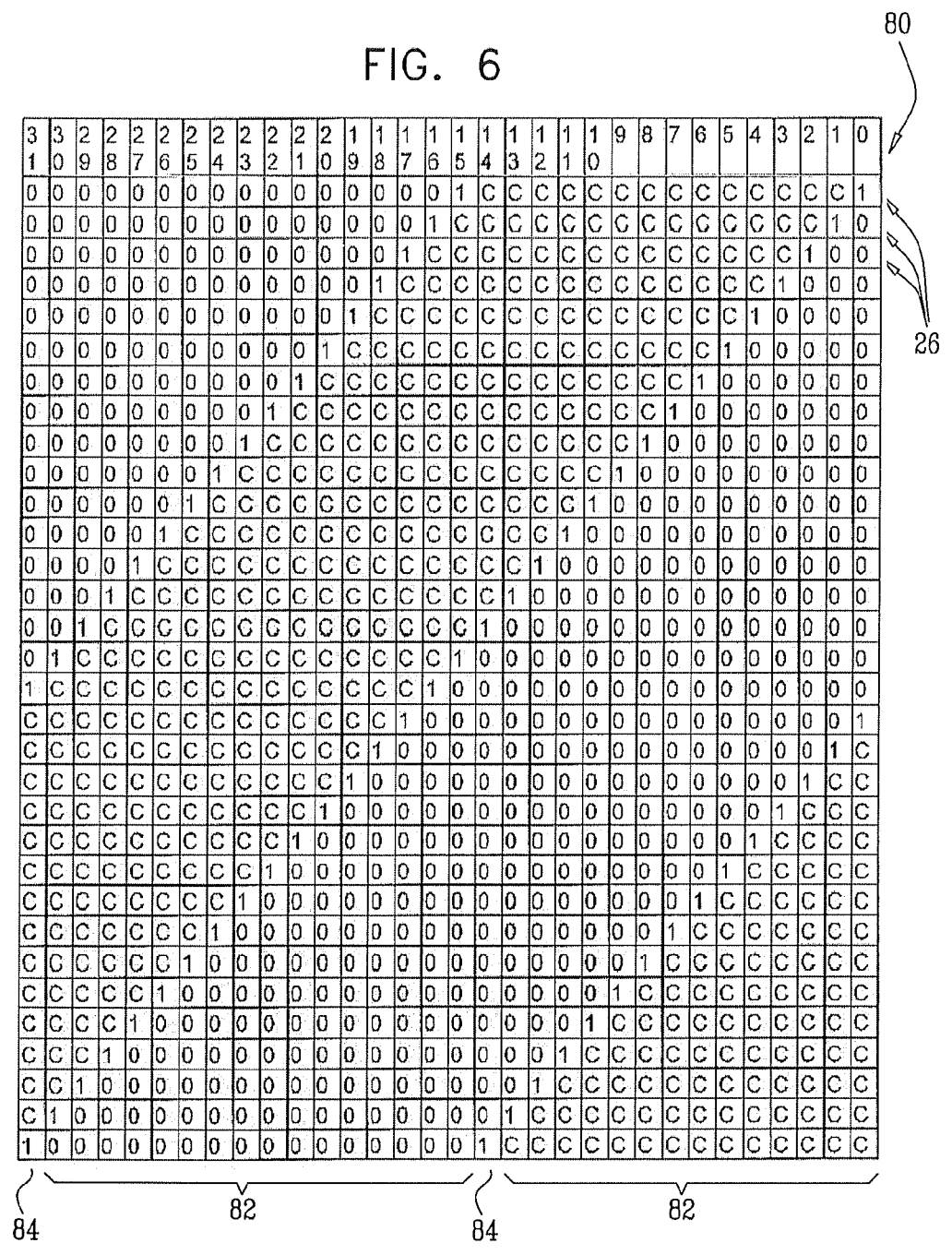

FIG. 6 is a table showing the assignment of count bits to cells 28 in set 26 at successive iterations of counting device 20, in accordance with another embodiment of the present invention. This embodiment is "stateless," in the sense that no shift state counter field is used. Rather, a subset 82 of the bits in set 26 that holds the count code is set off by delimiter bits 84 preceding and succeeding the sequence of bits in the count code. Unused bits 86 are set to a default value, which is typically different from the value of the delimiter bits. In the example shown in FIG. 6, set 26 comprises thirty-two bits, of which fourteen bits (marked "C") hold the count code. Delimiter bits 84 are set to "1", while unused bits 86 are set to "0". In each successive iteration through step 50, subset 82 is shifted left together with the accompanying delimiter bits.

In order to find the counter value, controller 22 reads out the bits in set 26 at step 70 (FIG. 4). To determine the shift of the count code at step 72, the controller searches for a sequence of sixteen unused bits (zeroes) that is bounded at both ends by delimiting ones in order. In most cases, as shown in FIG. 6, the sequence of unused bits wraps around the end of set 26. The shift of the count code is then given by the location of the delimiters. The controller thus locates the count code between the delimiters at step 74, and then uses the decoded count code together with the shift to compute the actual counter value at step 76, as explained above.

The "stateless" embodiment of FIG. 6 is advantageous in that all of the bits in set 26 may be used to the limit of their endurance, in contrast to the preceding embodiments in which the shift state counter bits are not fully exploited. On the other hand, by comparison with the "stateful" embodiment of FIG. 5, the embodiment of FIG. 6 requires that set 26 contain a relatively large number of bits, because the sequence of unused bits 86 must be longer than any possible sequence of consecutive zeroes that may occur in the count code held in subset 82. Therefore, subset 82 comprises less than half of the bits in set 26.

Figure 7:
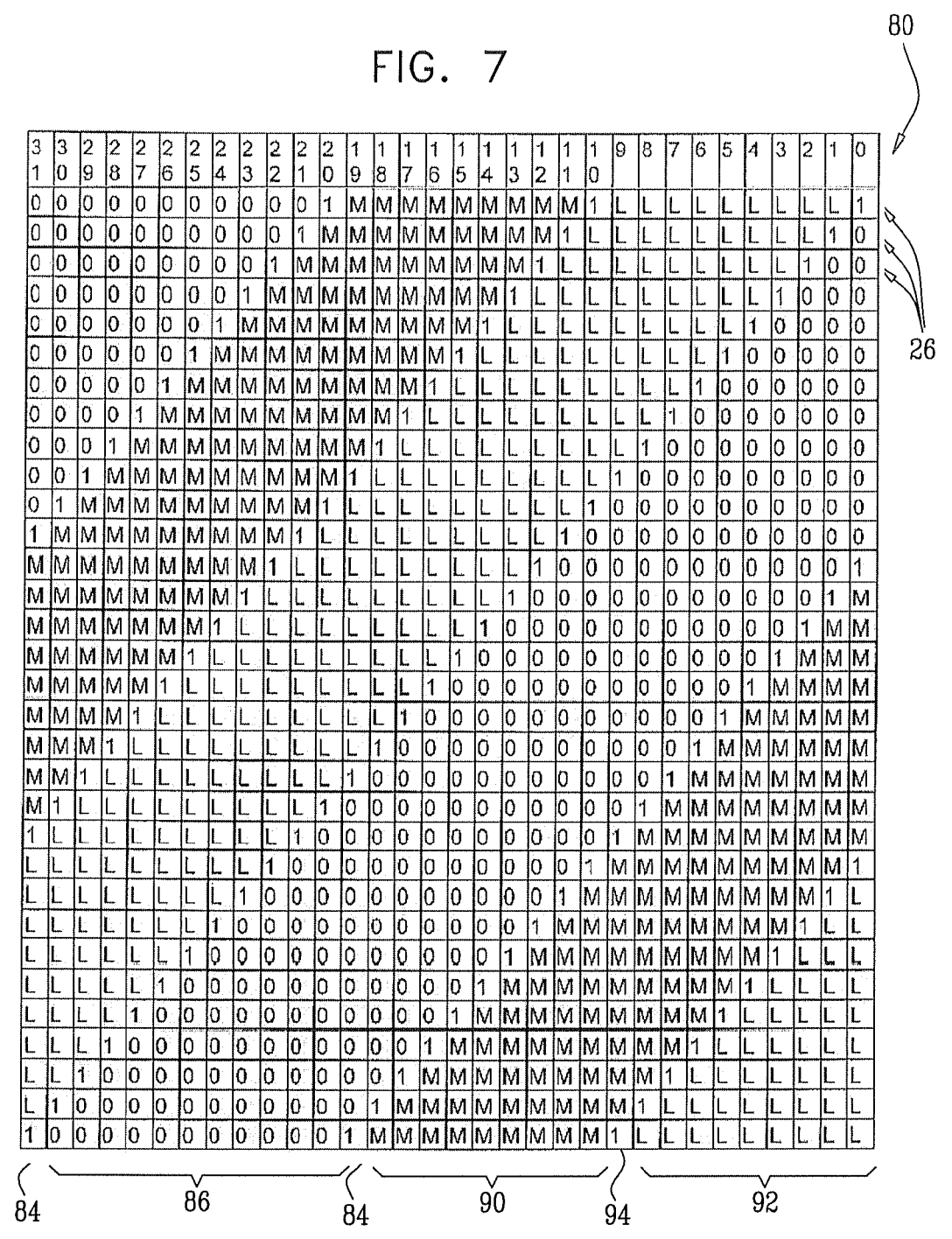

FIG. 7 is a table showing the assignment of count bits to cells 28 in set 26 at successive iterations of counting device 20, in accordance with yet another embodiment of the present invention. In this case, the count code comprises eighteen bits (assuming memory 24 has sufficient endurance to support a count code of this length), which are divided into nine-bit subsequences 90 and 92. The bits of the upper (more significant) subsequence are marked "M", while the bits of the lower (less significant) subsequence are marked "L". Delimiter bits 84 separate unused bits 86 from subsequences 90 and 92, and a further delimiter bit 94 separates subsequence 90 from subsequence 92.

Thus, although the count code overall is longer than the sequence of unused bits (which contains eleven bits in this example), delimiter bit 94 prevents any possible confusion between sequences of zeroes that may occur in the count code and the sequence of zeroes in unused bits 86. In other words, any sequence of consecutive zeroes that is longer than nine bits is immediately recognizable as the unused bits, and controller 22 may thus determine the shift at step 72 unambiguously. In this embodiment, however, the number of bits in the count code is greater than half the length of set 26, in contrast to the embodiment of FIG. 6. Therefore, the embodiment of FIG. 7 requires a relatively smaller allocation of bits in NVM 24 for the counter function.

Although the embodiments described above show certain specific allocations of bits and shift patterns, the principles of the present invention may similarly be implemented using other allocations and patterns, as will be apparent to those skilled in the art. It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A counting device, comprising:
   a set of memory cells, which are configured to store respective bits of a count code; and
   a controller, which is coupled to the memory cells so as to increment, in response to occurrences of a count input, the count code in the set of the memory cells from an initial value up to a preset bound in each of a plurality of successive iterations, and to shift the bits of the count code that are respectively stored in the memory cells in each of the iterations relative to a preceding iteration.

2. The device according to claim 1, wherein the count code is a Gray code.

3. The device according to claim 1, wherein the memory cells are a part of a non-volatile memory.

4. The device according to claim 3, wherein the non-volatile memory comprises a Flash memory.

5. The device according to claim 1, wherein the preset bound is defined by an endurance of the memory cells.

6. The device according to claim 1, wherein the controller is configured to read out a counter value by determining a shift of the bits of the count code in the memory cells, locating and decoding the count code responsively to the shift, and combining the decoded count code with a number of the iterations indicated by the shift in order to compute the counter value.

7. The device according to claim 1, wherein the set of the memory cells is a first set, and wherein the device comprises a second set of the memory cells for storing a state indicator, and wherein the controller is coupled to increment the state indicator and to reset the count code to the initial value upon receiving the count input when the count code has reached the preset bound.

8. The device according to claim 1, wherein the set of the memory cells is configured to hold data of a given length, and wherein the number of the bits in the count code is less than the given length, and wherein the controller is coupled to store the count code in a subset of the set of the memory cells, and to shift the bits so that the count code is stored in a different subset of the set of the memory cells in each of the successive iterations relative to a preceding iteration.

9. A counting device, comprising:

an array of memory cells, comprising a first set of the memory cells for storing respective bits of a count code and a second set of the memory cells for storing a state indicator; and a controller, which is coupled to the array so as to increment, in response to occurrences of a count input, the bits of the count code in the first set of the memory cells from an initial value up to a preset bound in each of a plurality of successive iterations, and upon reaching the preset bound in each of the successive iterations, to increment the state indicator and to initiate a new iteration in which the bits that are respectively stored in the memory cells are shifted relative to a preceding iteration.

10. The device according to claim 9, wherein the bits are barrel-shifted in each of the successive iterations.

11. The device according to claim 9, wherein the bits are shifted so that the count code is stored in a different subset of the first set of the memory cells in each of the successive iterations relative to the preceding iteration.

12. A counting device, comprising:

an array of memory cells, comprising a set of the memory cells that is configured to hold data of a given length and is allocated for storage of a count code consisting of a number of bits that is less than the given length; and a controller, which is coupled to the array so as to store the count code in a subset of the set of the memory cells, and to increment, in response to occurrences of a count input, the bits of the count code from an initial value up to a preset bound in each of a plurality of successive iterations, and to shift the bits so that the count code is stored in a different subset of the set of the memory cells in each of the successive iterations relative to a preceding iteration.

13. The device according to claim 12, wherein the controller is configured to write the count code to the subset of the set of the memory cells as a sequence of bits, and to write a predetermined delimiter value to the bits in the set of the memory cells that immediately precede and succeed the sequence.

14. The device according to claim 13, wherein the controller is configured to write a predetermined constant value, different from the delimiter value, to the bits in the set of the memory cells that are separated from the subset of the set of the memory cells by the bits that immediately precede and succeed the sequence.

15. The device according to claim 13, wherein the sequence comprises at least first and second sub-sequences, and wherein the controller is configured to write the predetermined delimiter value to at least one bit in the set of the memory cells that separates the first subsequence from the second subsequence.

16. The device according to claim 15, wherein the number of the bits in the count code is greater than one half of the given length.

17. A method for counting, comprising:

in response to occurrences of a count input, incrementing bits of a count code that are respectively stored in a set of memory cells from an initial value up to a preset bound in each of a plurality of successive iterations; and in each of the successive iterations, shifting the bits of the count code that are respectively stored in the memory cells relative to a preceding iteration.

18. The method according to claim 17, wherein the memory cells are a part of a non-volatile memory.

19. The method according to claim 17, and comprising reading out a counter value by determining a shift of the bits of the count code in the memory cells, locating and decoding the count code responsively to the shift, and combining the decoded count code with a number of the iterations indicated by the shift in order to compute the counter value.

20. The method according to claim 17, wherein the set of the memory cells is a first set, and wherein the method comprises storing a state indicator in a second set of the memory cells, and upon reaching the preset bound in each of the successive iterations, incrementing the state indicator and initiating a new iteration.

21. The method according to claim 20, wherein the bits are barrel-shifted in each of the successive iterations.

22. The method according to claim 17, wherein the set of the memory cells is configured to hold data of a given length, and wherein the count code consists of a number of bits that is less than the given length, and wherein shifting the bits comprises storing the count code in a different subset of the set of the memory cells in each of the successive iterations.

23. The method according to claim 22, wherein the count code comprises a sequence of bits, and wherein the method comprises writing a predetermined delimiter value to the bits in the set of the memory cells that immediately precede and succeed the sequence.

24. The method according to claim 23, wherein the method comprises writing a predetermined constant value, different from the delimiter value, to the bits in the set of the memory cells that are separated from the subset of the set of the memory cells by the bits that immediately precede and succeed the sequence.

25. The method according to claim 23, wherein the sequence comprises at least first and second sub-sequences, and wherein the method comprises writing the predetermined delimiter value to at least one bit in the set of the memory cells that separates the first subsequence from the second subsequence.

* * * * *